(12) United States Patent
Eurlings et al.

(10) Patent No.: US 10,928,928 B2
(45) Date of Patent: Feb. 23, 2021

(54) CONTROL PANELS AND METHODS OF CONTROLLING

(71) Applicant: ARRANGED BV, Bilzen (BE)

(72) Inventors: Martin Eurlings, Bilzen (BE); Tommie Kidjemet, Riemst (BE)

(73) Assignee: ARRANGED BV, Bilzen (BE)

( * ) Notice: Subject to any disclaimer, the term of this patent is extended or adjusted under 35 U.S.C. 154(b) by 50 days.

(21) Appl. No.: 16/077,809

(22) PCT Filed: Feb. 16, 2017

(86) PCT No.: PCT/EP2017/053455
§ 371 (c)(1),
(2) Date: Aug. 14, 2018

(87) PCT Pub. No.: WO2017/140753
PCT Pub. Date: Aug. 24, 2017

(65) Prior Publication Data
US 2020/0125184 A1    Apr. 23, 2020

(30) Foreign Application Priority Data

Feb. 17, 2016  (EP) .................................. 16156217
Apr. 22, 2016  (EP) .................................. 16166681
Sep. 13, 2016  (EP) .................................. 16188533

(51) Int. Cl.
*G06F 3/03*     (2006.01)
*G05G 9/047*    (2006.01)
(Continued)

(52) U.S. Cl.
CPC ....... *G06F 3/0312* (2013.01); *G05G 9/04792* (2013.01); *G06F 3/021* (2013.01);
(Continued)

(58) Field of Classification Search
CPC ........ G06F 3/0362; G06F 3/038; G06F 3/039; G06F 3/0412; G06F 3/0416;
(Continued)

(56) References Cited

U.S. PATENT DOCUMENTS 5,936,613 A    8/1999  Jaeger et al.
7,859,526 B2  12/2010  Konicek
(Continued)

FOREIGN PATENT DOCUMENTS

EP    2187290 A1    5/2010
WO  2010002840 A2    1/2010

OTHER PUBLICATIONS

International Search Report and Written Opinion from PCT Application No. PCT/EP2017/053455, dated May 11, 2017.

*Primary Examiner* — Nelson M Rosario
(74) *Attorney, Agent, or Firm* — Workman Nydegger (57) ABSTRACT

A control panel for controlling a device comprises a scanning device being a plane surface scanner configured for scanning instantaneously an image of a surface of interest. It also comprises a front panel with a front side surface facing the user and a back side surface facing the scanning device and thus being scanable and at least one controller element mounted in the front panel and having contrast markings at the back side facing the scanner device with respect to a color of other portions of the back side of the front panel so that a state of the at least one controller is recognizable from an optical image of the back side of the front panel.

19 Claims, 10 Drawing Sheets

(51) Int. Cl.
  *G06F 3/02*     (2006.01)
  *H03K 17/969*   (2006.01)
  *H04N 1/195*    (2006.01)

(52) U.S. Cl.
  CPC ........... *H03K 17/969* (2013.01); *H04N 1/195* (2013.01); *H04N 2201/0446* (2013.01)

(58) Field of Classification Search
  CPC ............... G06F 3/0421; G06F 3/044; G06F 2203/04104; G06F 2203/04106; H04H 60/04
  See application file for complete search history.

(56) References Cited

U.S. PATENT DOCUMENTS

| | | | |
|---|---|---|---|
| 2006/0256090 A1* | 11/2006 | Huppi | A63F 13/02 |
| | | | 345/173 |
| 2008/0158144 A1 | 7/2008 | Schobben et al. | |
| 2008/0238879 A1* | 10/2008 | Jaeger | G06F 3/03545 |
| | | | 345/173 |
| 2014/0036168 A1 | 2/2014 | Ludwig | |
| 2015/0002487 A1 | 1/2015 | Miles | |
| 2015/0062461 A1 | 3/2015 | Tallal et al. | |
| 2016/0224129 A1* | 8/2016 | Wussler | G06F 3/0362 |

\* cited by examiner

CONTROL PANELS AND METHODS OF CONTROLLING

FIELD OF THE INVENTION

The invention relates to the field of systems and methods for controlling. More particularly, the present invention relates to control panels for controlling knobs, sliders, buttons and alike in an efficient way, as well as to corresponding methods for controlling.

BACKGROUND OF THE INVENTION

Music bands are using a variety of synthesizer, mixing consoles and control panels, plug-ins to arrange their music. Typically these panels or plug-ins have a width of 19 inch. Since there are a large number of such devices used by the band, the band typically ends up with racks full of buttons, knobs, linear faders and sliders. Nevertheless, very often, depending on the musical composition, only a few of the buttons, knobs, faders and sliders are actually used. For the devices that are used, the hardware obviously cannot be modified. Some makers, like for example Korg in cooperation with Littlebits Inc recognized this problem of fixed devices and have brought out a kit on the market, where people can assemble their own synthesizer or control panel. Nevertheless, even this system has its limitations.

US2015/0002487 describes a method/device that tries to solve the problem of the flexibility of the control panel. The patent describes solving the flexibility problem by providing a display such that the configuration of the markers or visual indicators (min/max, scales, legends, etc.) for the knobs can be adapted. In other words, whereas the hardware remains the same, the visual indicators are adapted to cope with the flexibility of the control panel. That way the user can define through some software, the description, scale or marking of each knob. For example, instead of having a knob with a scale from 0 to 10, the display can change it to 1 to 50 for that particular knob or from A to K.

Nevertheless, there is room for efficient, reliable and/or flexible solutions.

SUMMARY OF THE INVENTION

It is an object of the present invention to provide good control panels as well as methods for controlling.

It is an advantage of embodiments of the present invention that efficient control panels can be provided for situations where a lot of equipment is to be used, such as for example in music settings, where bands use a plurality of control panels, but also for example in industry, automotive or household.

It is an advantage of embodiments of the present invention that control panels are provided that are reliable. For example it is an advantage of embodiments of the present invention that the operation is not influenced by the user having dry fingers or by the user wearing gloves.

The object is obtained by embodiments of the present invention.

The present invention relates to a control panel for controlling a device, the control panel comprising
a scanning device, the scanning device being configured for obtaining instantaneously an image of a surface of interest,
a front panel with a front side surface facing the user and a back side surface facing the scanning device and thus of which an image can be obtained, and
at least one controller element mounted in the front panel and having contrast markings at the back side facing the scanner device with respect to a colour of other portions of the back side of the front panel so that a state of the at least one controller is recognizable from an optical image of the back side of the front panel.

Where in embodiments of the present invention reference is made to one item facing the scanner device, this includes that the surface of interest is substantially parallel with the scanner device but embodiments are not limited thereto and the surface of interest may be under an angle with respect to the scanner device, but such that it still can be imaged by the scanner device.

The controller element may be any of a switch, a knob, as slider or a combined knob and slider.

The control panel may comprise a processor for deriving a state of the at least one controller element from an image scanned from the back side of the front panel and the at least one controller element, and for generating a signal for applying to a corresponding electronic, electromechanical or mechanical component to be controlled by the at least one controller element.

The front panel may be releasable mountable to the scanning device.

The front panel may comprise an identification means for identifying a type of the front panel.

The identification means may be a barcode scanable by the scanning device.

The scanning device may comprise no moving scanner head or even no moving parts.

The scanning device may be a flatbed scanner.

The scanning device may be any of a tablet or displaying device comprising the functionality of imaging a surface of interest instantaneously.

The contrast markings may be formed by a dark back side surface of the front panel with light marks on the controller element, a light back side surface of the front panel with dark marks on the controller element, or a transparent back side surface of the front panel with mirror like marks on the controller element.

The scanning device may comprise a plurality of photodetectors, wherein the distance between two neighboring photodetectors is maximally 800 micrometer.

The scanning device may be adapted for imaging at a rate of minimally 10 frames per second.

The at least one controller element may comprise a concave surface facing the scanning device, for converging radiation, incident on the controller element, onto the scanning device. The concave surface may be adapted for focusing incident radiation on the scanning device.

The present invention also relates to a method of controlling one or more electric, electromechanical or mechanical component, the method comprising
imaging instantaneously a backside of a front panel to which at least one controller element is mounted, whereby a contrast marking is present at the back side of the controller element facing a scanning device, with respect to a colour of other portions of the back side of the front panel,
deriving from the obtained image a state of the controller element and
controlling the electric, electromechanical or mechanical component in accordance with the derived state of the controller element.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a scanning device, reference is made to a device reference is made to a device allowing to instantaneously obtaining an image of a surface. The scanning device may be a plane surface scanner. In some embodiments, tablets (such as for example iPad, Microsoft Surface Tablet, etc.) or display devices having an instantaneously full surface scanning or imaging function also can be used as scanning device. Advantageously, the scanning device thus does not have a moving scanning head but is adapted for instantaneously scanning or imaging a surface, rather than scanning or imaging it line by line or block by block. In other words, the scanning device can be any device allowing to get an image or scan of a surface of interest instantaneously. The scanning device thus also could be referred to as imaging device In a first aspect, the present invention relates to a control panel for controlling a device. According to embodiments of the present invention, the control panel comprises a scanning device configured for scanning instantaneously an image of a surface of interest, e.g. a full surface. Such a scanner also may be referred to as a flatbed scanner. The plane surface scanner thus typically has no moving scanning head.

The device furthermore comprises a front panel with a front side surface facing the user and a back side surface facing the scanning device and thus being able to be imaged by the plane surface scanner.

The device furthermore comprises at least one controller element mounted in the front panel. Such a controller element may be a button, a knob, a slider, or any other element allowing to set a value of an electrical, electromechanical or mechanical component. According to embodiments of the present invention, the controller element has contrast markings at the back side of the front panel facing the scanner device with respect to a colour of other portions of the back side of the front panel so that a state of the at least one controller is recognisable from an optical scan or image taken of the back side of the front panel. In other words, a state of the at least one controller element is in the present control panel detected optically.

In embodiments of the present invention, a control panel with changeable front panel configuration thus is provided, wherein the control items (knobs, sliders, buttons) positions/states can be digitally read using a scanner device without moving head.

Figure 1:
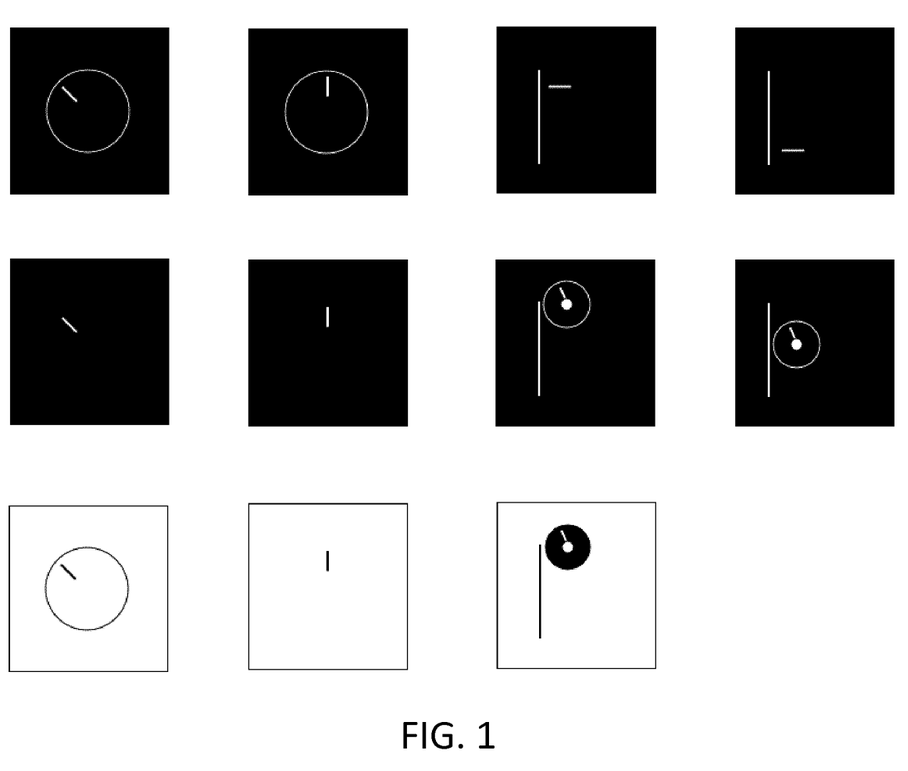
FIG. 1 illustrates a plurality of contrast markers, as can be used in embodiments of the present invention.

The principle of the invention is that a scanner plate or another planar device that incorporated such technology, without a moving linear scanner head, can instantly make a full image, e.g. full scan, of a surface. This will allow capturing full surfaces of interest and by that recognize the differences in the surfaces that are imaged/scanned. The buttons, knobs and sliders have marks/indicators facing the scanner plate that have the opposite light absorption or reflection properties than the other areas of the mounting plate facing the scanner plate. Basically for every scanner, the more contrast there is, the easier will be image capturing. A few examples of these contrast indicators/marks are shown in FIG. 1.

By way of illustration, the present invention not being limited thereto, a number of standard and optional features will now further be discussed with reference to a number of particular examples and particular embodiments of the present invention.

Figure 2:
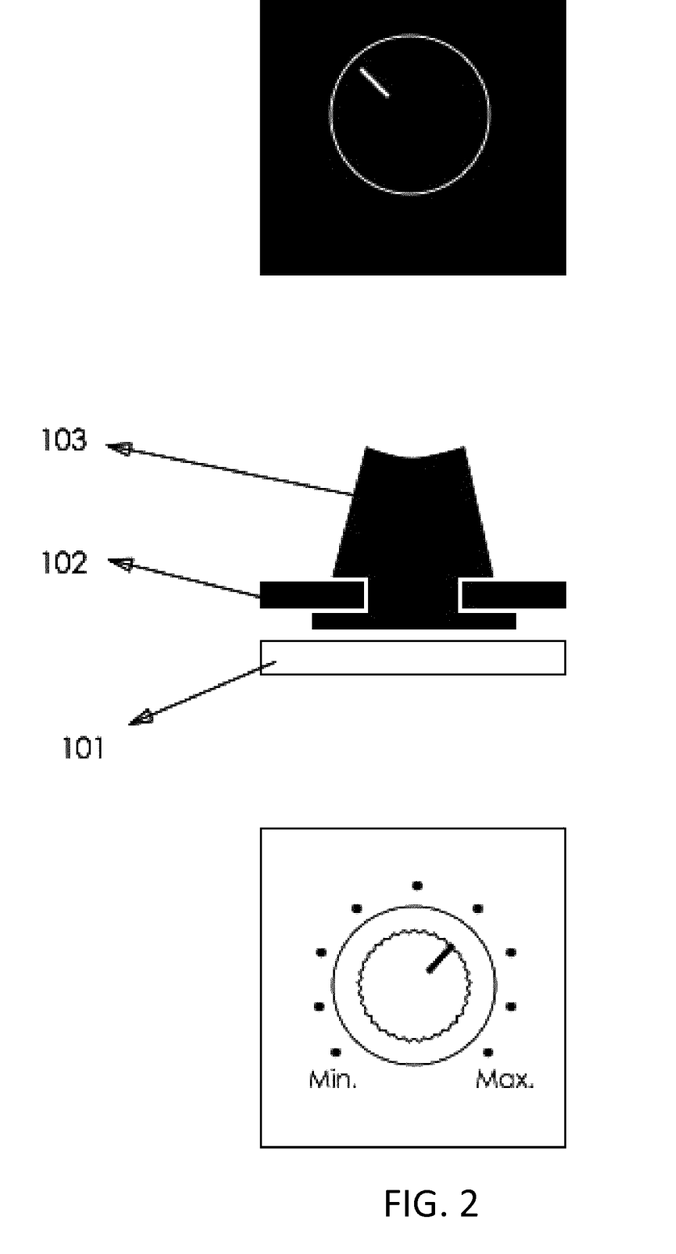
FIG. 2 illustrates a schematic overview of a control panel, according to embodiments of the present invention (upper drawing: back side facing the scanner plate; middle drawing: cross-section; lower drawing: front side facing the user).

FIG. 2 illustrates a schematic drawing of an exemplary control panel, illustrating a scanner device 101, a front panel 102 and a controller element 103 mounted on the front panel 102. The concept of at least some embodiments of the present invention is making use of a scanning device to read out the state of at least one controller element, but typically of a plurality of controller elements. Traditional scanning devices utilise moving scanner heads, or require the object to be moved across a static scanning head. The scanning device as envisioned will have no moving scanning head, as the scanning is expected to happen in real-time, according to the invention.

A real time flat surface scanner that can scan a complete area in one step can be used. It is to be noticed that very often, the resolution of the scanner is of less importance for the current application. The scanner may comprise a plurality of photodetectors for detecting an image. The distance between two neighboring photodetectors may in some embodiments be maximally 800 micron. The backside of the controller element has contrast markings, e.g. high contrast markings, with respect to other portions of the back surface of the front panel. Such a contrast marking may be caused by the controller element at a back side being made of a light-reflecting material, whereas the remainder of the back side surface of the front panel is made of a translucent or light-absorbing material, or vice versa. Other examples of possible contrast combinations are for example a dark back side surface of the front panel (e.g. black) with light (e.g. white) marks on the controller element, a light back side surface of the front panel (e.g. beige) with dark marks (e.g. grey) on the controller element, a transparent back side surface of the front panel with mirror like (glossy silver) marks on the controller element. The high contrast enables use of monochrome images to determine the state of the controller element. So the more contrast there is, the better the digital reading will be. Being able to use monochrome images, coupled with a low resolution enables the control panel to be made in a cost-effective way. The front side of the front panel 102 can have fixed marking, scales and indicators that the user can see and refer to when changing knob or slider position. The back side has all relevant high contrast markings necessary for a good scanning result, as described above.

In embodiments of the present invention, the device comprises a plane surface scanning device. The plane surface scanning device according to embodiments is a scanning device without moving scanning head. A plurality of flatbed scanning devices can be used. Several techniques for scanning without the need for a moving scanning head have been described, i.e. US2015062461 A1, U.S. Pat. No. 7,859,526 B2, US20080158144 A1, US20140036168 A1 & WO2010/002840 A2 among others. In case of U.S. Pat. No. 7,859,526 B2, US20080158144 A1 & US20140036168 A1, the scanning device is part of a display device, therefor using a pixelated light-source. Although this can be used, there is no need for a pixelated light-source since this seems needlessly complicated and exceedingly expensive. WO2010/002840 A2 describes a scanning device making use of a non-pixelated light-source, i.e. an edge coupled fluorescent light, an edge coupled LED, or an organic light emitting diode (OLED). In one example, the scanning device without moving scanning head comprises a matrix array of photodetectors (101) and a light-source as described for example in WO2010/002840 A2.

Figure 9:
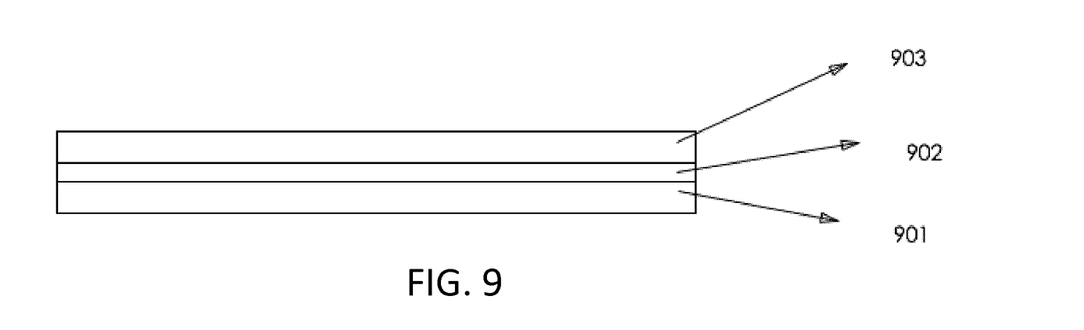
FIG. 9 illustrates a schematic representation of a scanning device as can be used in a control panel according to an embodiment of the present invention.

In one particular set of embodiments, a scanning device as described in US2015062461 A1 can be used. It describes a large area surface scanning technique in a contactless user interface based on transparent electrodes on a transparent substrate, e.g. plastic or glass. These electrodes are made of transparent conductive oxide and are used to form an array of photo-detectors. This array of photo-detectors allows light to pass through the array, which then is reflected or absorbed by an object placed on the surface. A scanning system like this can thus be used in a control panel according to embodiments of the present invention. By way of illustration, a scanning device as described in US2015062461 A1 is shown in FIG. 9, illustrating a light source 901, an array of photodetectors 902, and a transparent protective layer 903.

One typical component of the flatbed scanning device are the detectors used for capturing data.

The detectors may for example be photo-detectors which may for example be formed by printing techniques on electrodes, also called printed electronics, making for a cost-effective production process. An organic photo detector (OPD) layer is formed which can be deposited on an organic thin film transistor (OTFT) layer.

The scanning device may use any technology of photo-detectors, including active pixel sensors, amorphous silicon (a-Si) p-i-n or n-i-p photo-detectors, charged-coupled detectors (CCDs), organic photo-detectors, or any other device that turns photons into electrical signals.

The photo-detectors may be arranged on top or beneath of the light-source.

Figure 7:
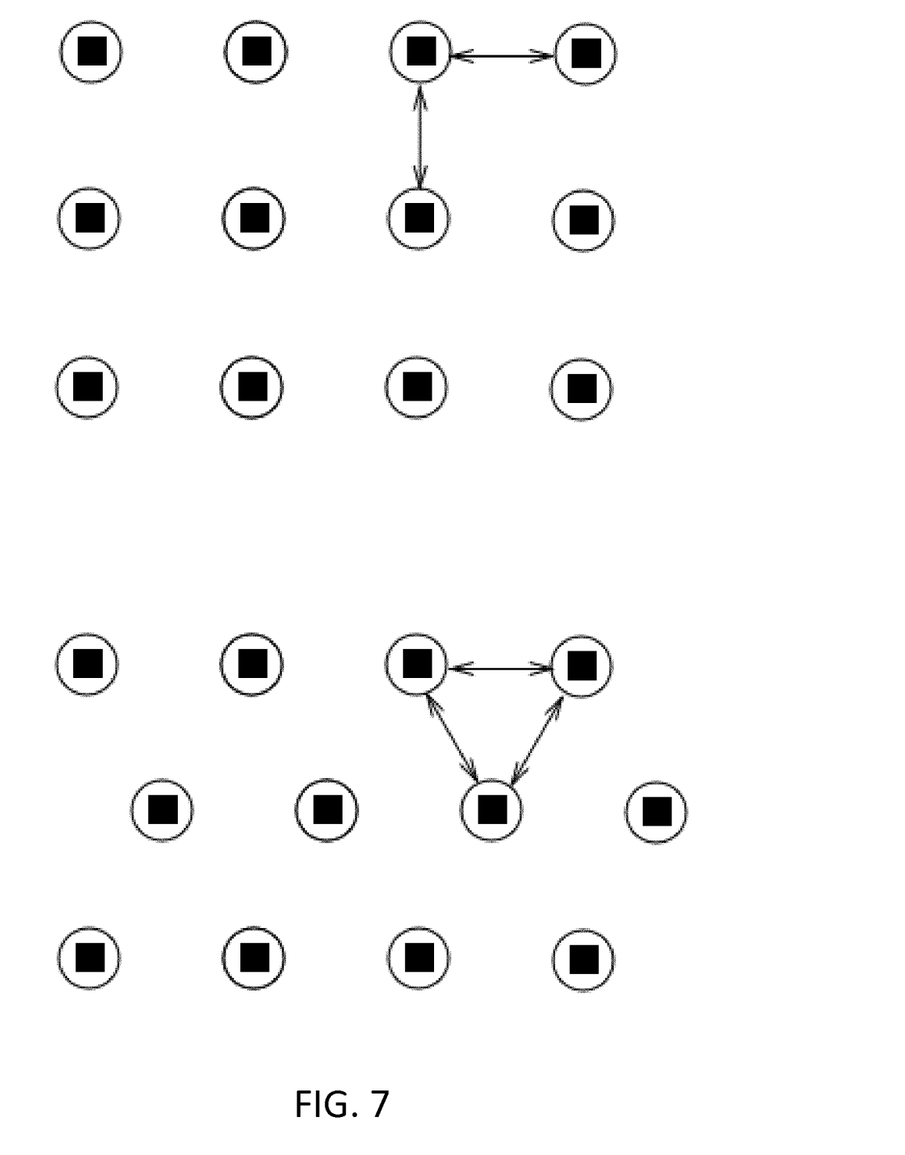
FIG. 7 illustrates an arrangement of photo detectors as can be used in a scanner as can be used in an embodiment of the present invention.

The photo-detectors may be, in one example, uniformly spaced apart at a maximum of 800 microns from one another, forming an array, providing a good scanning resolution. The latter is illustrated in FIG. 7. This allows for accurately recognizing the state of a controlling element. The scanning rate may in some examples be at least 10 full frames per second, thus achieving a high responsiveness of the control panel.

Another typical component of the flatbed scanning device is the light source used. The light source may be any suitable light source, such as for example a substrate with an edge-coupled fluorescent light, a substrate with edge-coupled LEDs or an organic light-emitting diode (OLED).

As indicated above, the above scanning device could also be a tablet device or display device that is adapted for imaging instantaneously.

According to embodiments of the present invention, the control panel, also referred to as multiple view control panel scanning device MCPSD, is equipped with a processing device that converts the data taken by the scanning device into an output, i.e. a state of the controller elements. In the case that a tablet (PC) device or display device or another device having an instantaneous scanning function is used that has already an incorporated image scan controller, then of course the incorporated controller can take over this function and only software is needed to convert the read image into output commands for connected equipment (e.g. amplifiers, synthesisers components; MIDI interfaces). Typically, this output is used for setting the electrical, electromechanical or mechanical components that are to be controlled.

Power supplied to the device can come from an internal or external power supply.

Figure 3:
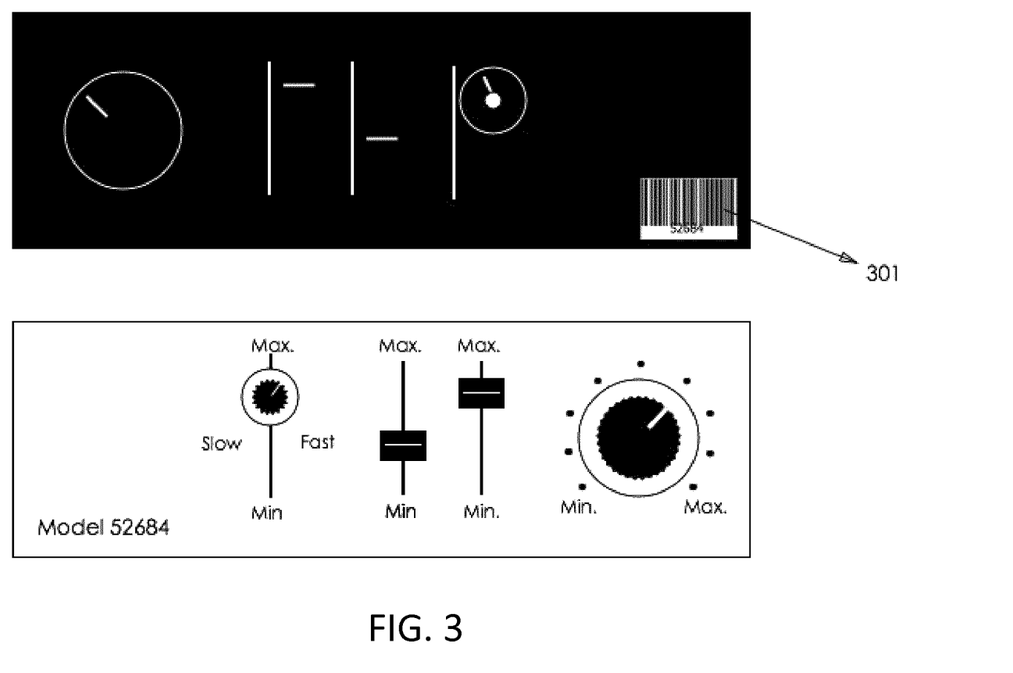
FIG. 3 illustrates an example of a frontplate as seen from the backside (by the scanner) and as seen from the frontside, according to embodiments of the present invention.
Figure 4:
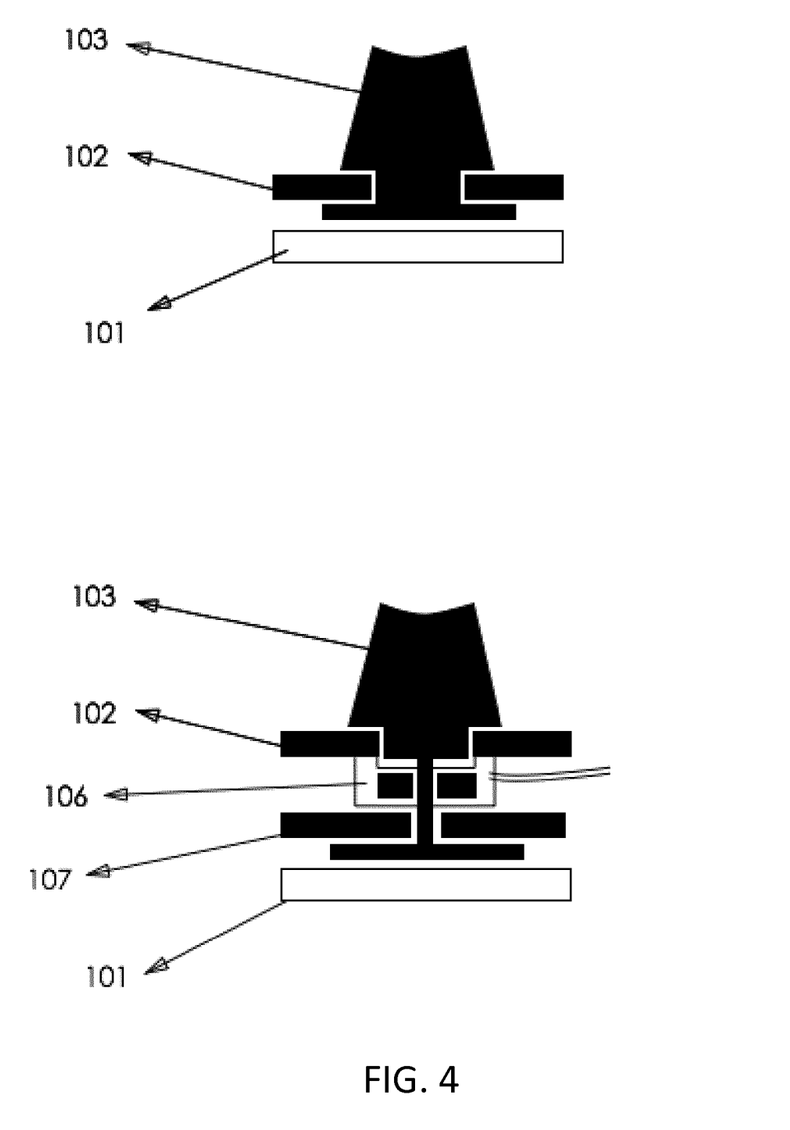
FIG. 4 illustrates two examples of a knob as can be used in an embodiment of the present invention (upper drawing: cross section of example knob; lower drawing: cross section of example knob with positioner, e.g. electrical motor).
Figure 5:
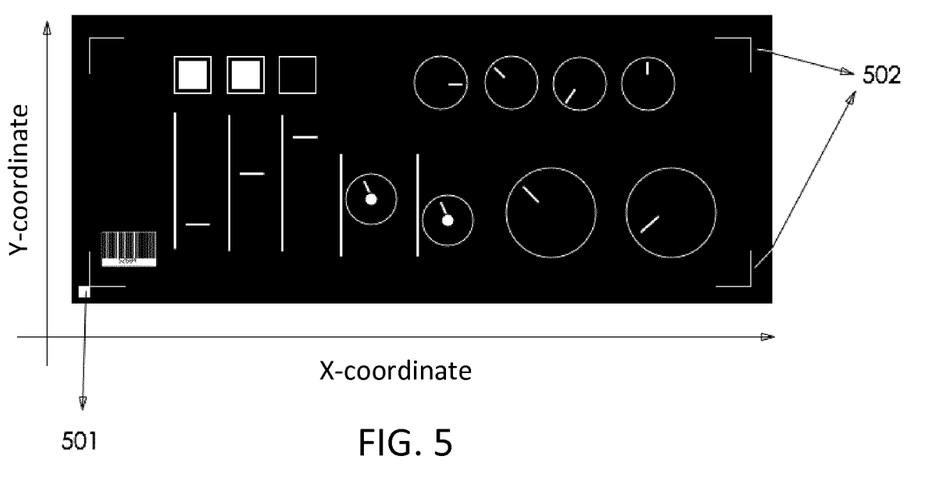
FIG. 5 illustrates an example of a back side of a control panel front plate facing the scanner plate, as can be used according to embodiments of the present invention.

In some embodiments it can be advantageous to integrate an additional spacer zone where electrical components can be installed and connected through wires. This is shown in FIG. 4 illustrating a system without spacer zone (top) and a system with spacer zone (bottom). For example, in case the knobs or sliders would require a motor (106) to allow automatic movement of the knob to a selected position, such an additional spacer zone may be advantageous. Use can then be made of a spacer plate (107) that acts as the plate facing the scanner device (101). This spacer plate then forms the backside of the front panel and the spacer plate then has all relevant high contrast markings necessary for a good scanning result As will be understood, the front panel may be interchangeable so the system may be adapted for operating with different front panels. Typically the scanner device stays in the rack, but the front panels typically are interchangeable. In some embodiments, the front panel may be provided with a bar code (301) on the backside of the front panel (FIG. 3) facing the scanner plate. The latter assists in an easy and simple identification of what control panel type is mounted in the control panel. This bar code information could be used by software that gives each knob or slider a specific function. It would be advantageous on the backside of the panel (FIG. 5) facing the scanner plate, having also reference position markings (502) and one specific X/Y 0-0 coordinate marking (501). This will make it easier for the scanner software to precisely define the X-Y coordinates.

Figure 6:
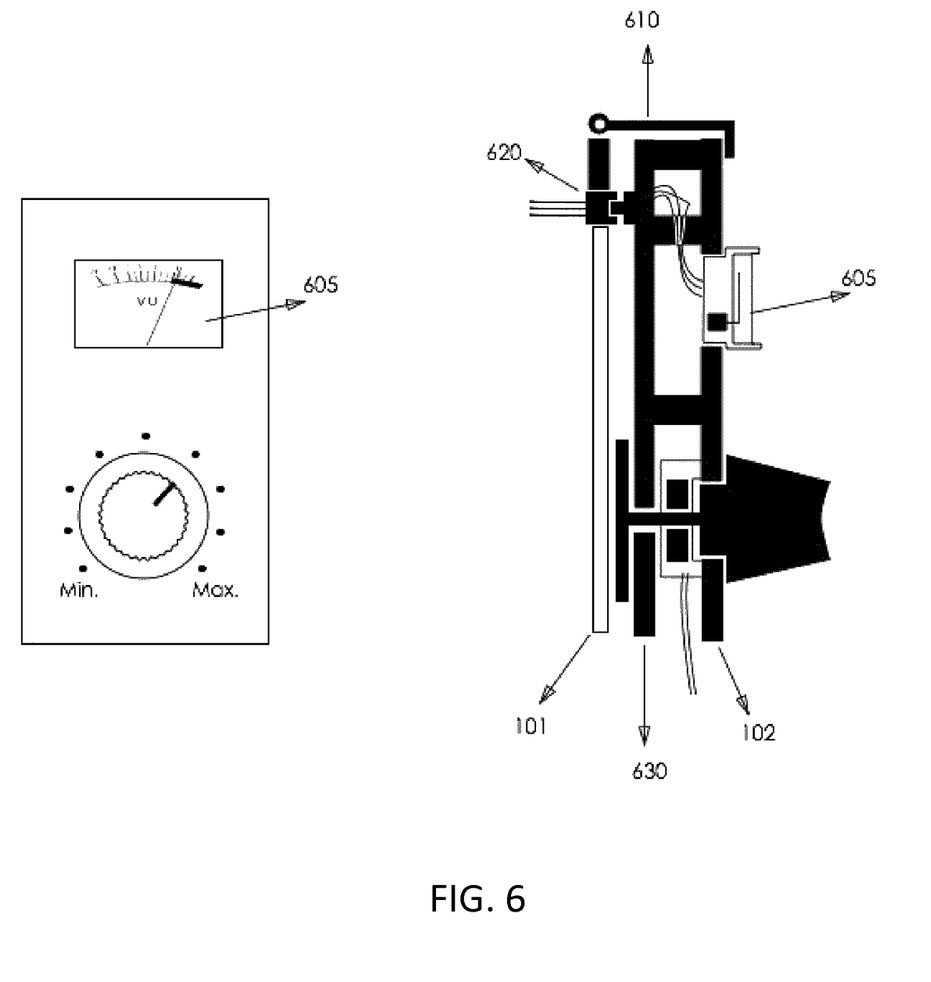
FIG. 6 illustrates an example of a control panel setup according to one embodiment of the present invention.

The control panel can consists of various parts that have to be mounted and connected. This is shown in FIG. 6. Connectors (620) will connect the devices in the spacer zone (motors, LED indicators, miniature LCD screens, VU meters (605)) with the rest of the apparatus. The mounting of the different front panels (102) can be achieved through, clamping systems (610), bolting or other quick connect methods. Important is that the scanner device stays in the rack and only the front panels should be interchangeable.

Figure 11A:
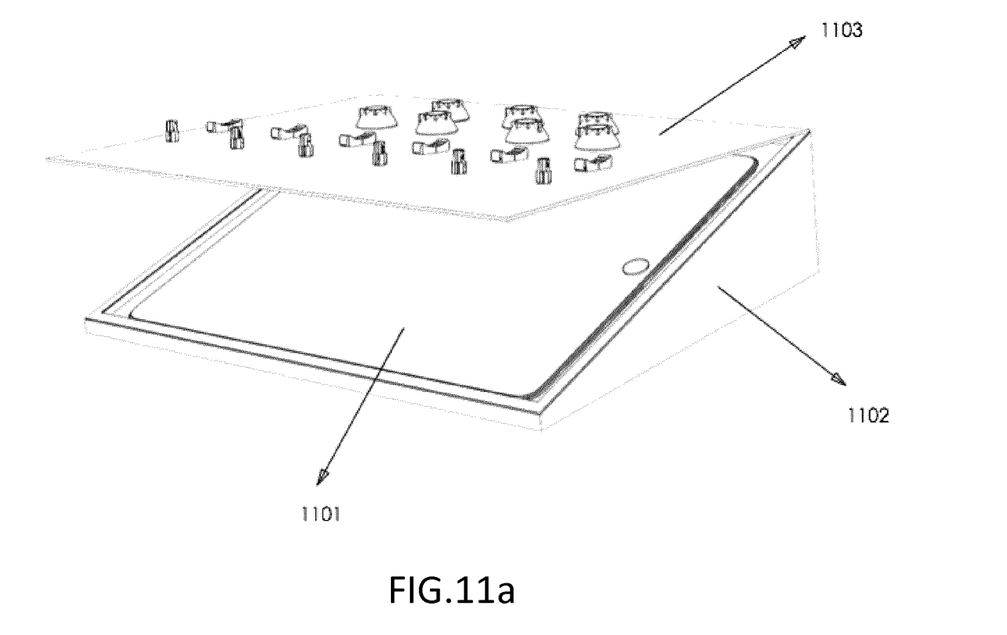
FIGS. 11a and 11b a schematic presentation of a tablet or display device installed in a holder with changeable front plates.
Figure 11B:
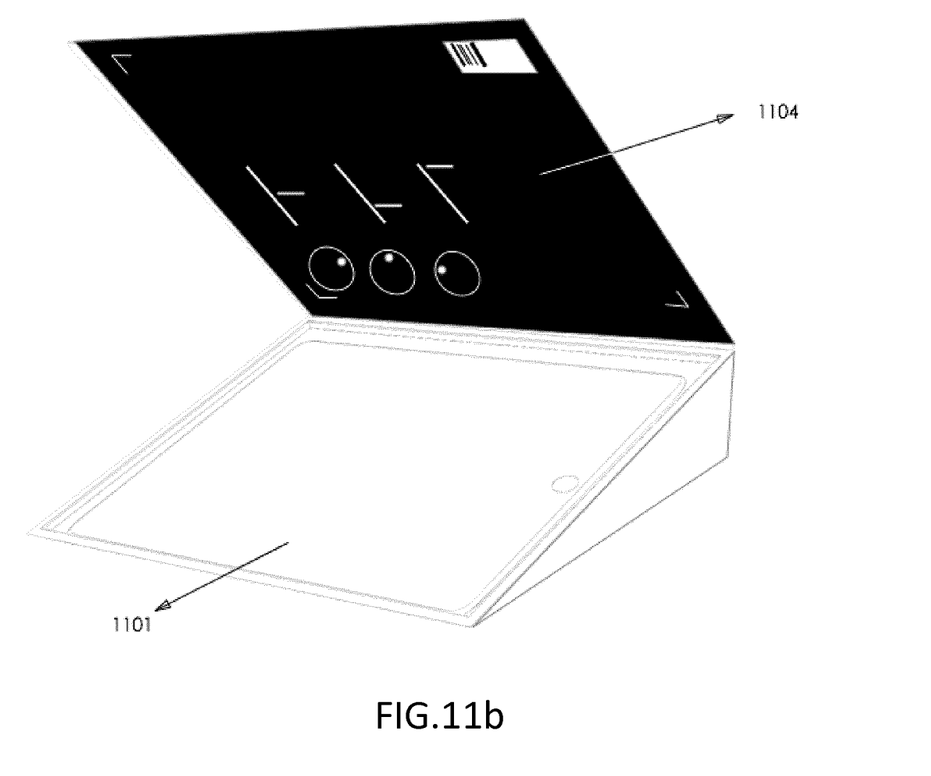

For the case of tablet devices or screen devices used as scanning device, a schematic installation is shown in FIGS. 11a and 11b. A tablet or screen device (1101) is positioned in a holder, the front plate (1103) is laid over the tablet scanning surface. In FIG. 11b you can see the backside of the front panel (1104) with all the indicators and markings. The holder (1102) can be horizontal or inclined, or in some cases even vertical, when for example clips or suction cups are used to tightly connect the front plate to the tablet or screen device.

Tactile sensations of knobs and sliders can be introduced by including click or dent sensations. Maximum or minimum settings can be achieved by limiting the turning radius of the knobs (a left and right limit, eventually with an additional zero detent) through mechanical means.

Figure 8:
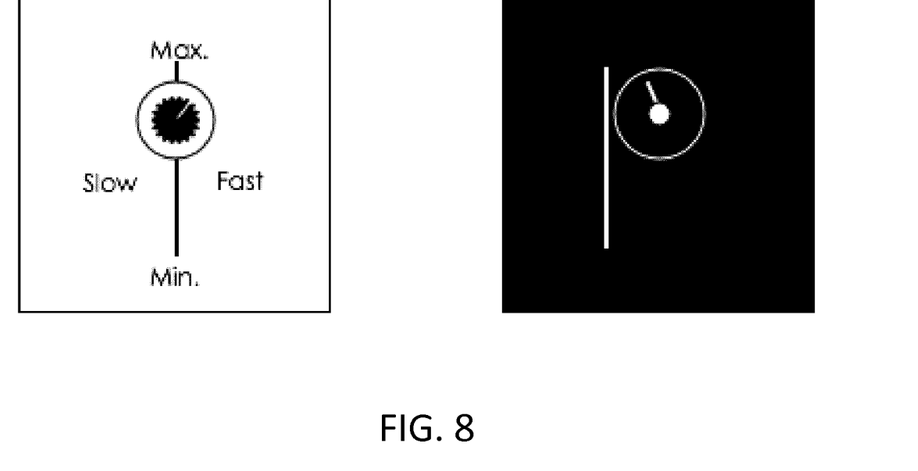
FIG. 8 illustrates a knob slider combining the function of a turning knob and a slider, as can be used in embodiments of the present invention.

In conventional systems, a slider with integrated knob using conventional potentiometer-technology will be difficult to produce and not be that reliable, because the wires needed for the knob potentiometers would hinder the movement of the slider potentiometer or the different wires would wear under the frequent movements. With a control panel according to embodiments of the present invention, such a slider with integrated knob can be easily provided since no wires need to be directly connected to the slider with integrated know. The position of the slider and the knob are 2 positions that can be easily detected by the scanner plate. Adding the position of the slider mark with the position of the knob mark results in a combined position, again easily to be read by the scanner plate. An example thereof is shown in FIG. 8.

In some embodiments, coated straight lines are used on the knob or slider facing the scanner. Nevertheless, in other embodiments, concave areas are used on the knob or slider facing the scanner, such that effects induced by the gap between the scanner surface and the front plate is corrected for. This results in a better resolution of the device. More particularly, a concave area reflects light that is scattered over the gap in a concentrated manner back into a focussed area on the scanner device surface. A coated line or dot may result in a rather broad diffusion of the reflected light and thus may result in a less accurate reading for the scanner device. Using concave surfaces thus help in obtaining a more accurate reading.

Such concave areas can be easily formed during manufacturing, for example if the knobs and sliders are made using Injection moulding technology, by adjusting the mould design. After moulding these part, the concave areas can be coated with a highly reflective (mirror like) coating, for example coatings containing silver or aluminium pigments. Other technique could be to apply a reflective foil in the concave area. Furthermore, it also is to be noted that other techniques for creating knobs or sliders with a concave surface also can be used, such as for example but not limited to 3D printing.

Figure 10:
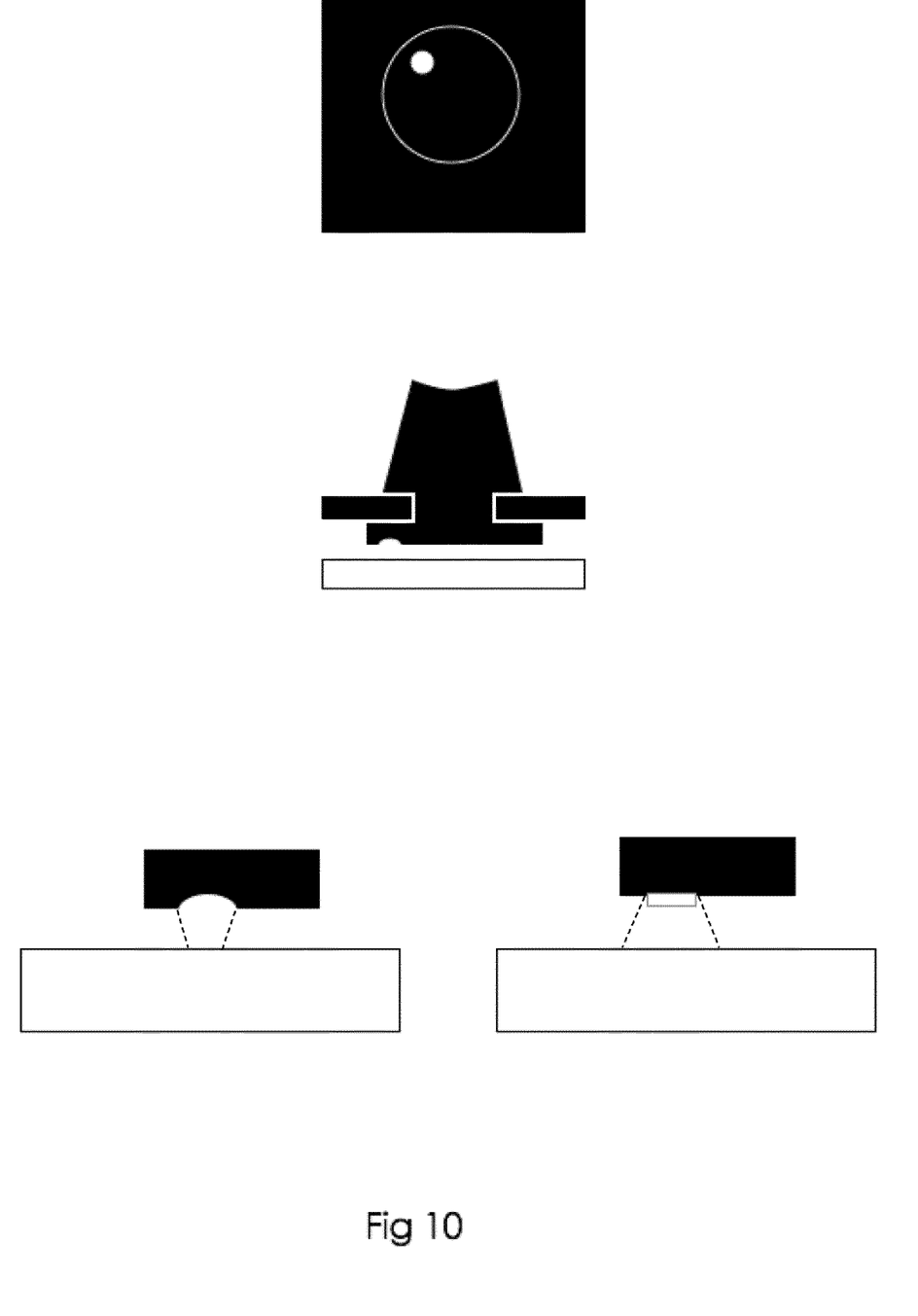
FIG. 10 illustrates the difference between a concave shape reflector and a coated or printed reflector on a planar surface (upper drawing: back side facing the scanner plate; middle drawing: cross-section; lower left drawing: system with a concave reflector; lower right drawing: system with a reflector printed or coated on a planer surface).

By way of illustration, FIG. 10 illustrates the advantage of a concave surface in a backside of a knob facing the scanner surface. In the upper and middle drawings of FIG. 10 a view on the backside of the knob and a cross-sectional view is shown. In the cross-sectional view a knob with a concave surface is shown. FIG. 10 lower drawing left illustrates how light reflects at the concave surface, resulting in a focussed beam on the scanner surface. By way of comparison the diffused radiation beam obtained when using a planar surface is also shown in FIG. 10 lower drawing right. Due to the focus of the beam, a better resolution can be obtained with the control device.

In one aspect, the present invention also relates to a method for controlling one or more electric, electromechanical or mechanical component. The method comprising scanning instantaneously a backside of a front panel to which at least one controller element is mounted, whereby a contrast marking is present at the back side of the controller element facing the scanner plate, with respect to a colour of other portions of the back side of the front panel. The method also comprises deriving from the scanned image a state of the controller element and controlling the electric, electromechanical or mechanical component in accordance with the derived state of the controller element. The method may also comprise one or more or all steps corresponding with the functionality of one or more or all components of a device as described in the first aspect.

The invention claimed is:

1. A control panel, comprising:
a scanning device, the scanning device being configured for obtaining instantaneously an image of a surface of interest,
a front panel with a front side surface facing a user and a back side surface facing the scanning device and thus of which an image can be obtained, and
at least one controller element mounted in the front panel and having contrast markings at the back side facing the scanner device with respect to a color of other portions of the back side of the front panel so that a state of the at least one controller is recognizable from an optical image of the back side of the front panel;
wherein the scanning device comprises a plurality of photodetectors, wherein a distance between two neighboring photodetectors is maximally 800 micrometer.

2. The control panel according to claim 1, wherein the at least one controller element is any of a switch, a knob, a slider or a combined knob and slider.

3. The control panel according to claim 1, wherein the control panel comprises a processor for deriving a state of the at least one controller element from an image scanned from the back side of the front panel and the at least one controller element, and for generating a signal for applying to a corresponding electronic, electromechanical or mechanical component to be controlled by the at least one controller element.

4. The control panel according to claim 1, wherein the front panel is releasably mountable to the scanning device.

5. The control panel according to claim 1, wherein the front panel comprises an identification means for identifying a type of the front panel.

6. The control panel according to claim 5, wherein the identification means is a barcode scannable by the scanning device.

7. The control panel according to claim 1, wherein the scanning device comprises no moving parts.

8. The control panel according to claim 1, wherein the scanning device is a flatbed scanner.

9. The control panel according to claim 1, wherein the scanning device is any of a tablet or displaying device comprising the functionality of imaging a surface of interest instantaneously.

10. The control panel according to claim 1, wherein the contrast markings are formed by a dark back side surface of the front panel with light marks on the at least one controller element, a light back side surface of the front panel with dark marks on the at least one controller element, or a transparent back side surface of the front panel with mirror like marks on the at least one controller element.

11. The control panel according to claim 1, wherein the scanning device is adapted for imaging at a rate of minimally 10 frames per second.

12. The control panel according to claim 1, wherein the at least one controller element comprises a concave surface facing the scanning device, for converging radiation, incident on the at least one controller element, onto the scanning device.

13. The control panel according to claim 12, wherein the concave surface is adapted for focusing incident radiation on the scanning device.

14. A method of controlling one or more electric, electromechanical or mechanical component, the method comprising:
imaging instantaneously a backside of a front panel to which at least one controller element is mounted, whereby a contrast marking is present at the back side of the controller element facing a scanning device, with respect to a colour of other portions of the back side of the front panel, wherein said imaging is based on a plurality of photodetectors, wherein the distance between two neighboring photodetectors is maximally 800 micrometer,
deriving from an obtained image a state of the at least one controller element and
controlling the one or more electric, electromechanical or mechanical component in accordance with the derived state of the at least one controller element.

15. The control panel according to claim 1, wherein the scanning device comprises organic photodetectors or photodetectors based on amorphous silicon.

16. A control panel, comprising:
a scanning device, the scanning device being configured for obtaining instantaneously an image of a surface of interest,
a front panel with a front side surface facing a user and a back side surface facing the scanning device and thus of which an image can be obtained, and
at least one controller element mounted in the front panel and having contrast markings at the back side facing the scanner device with respect to a color of other portions of the back side of the front panel so that a state of the at least one controller is recognizable from an optical image of the back side of the front panel;

wherein the scanning device is adapted for imaging at a rate of minimally 10 frames per second.

17. The control panel according to claim 16, wherein the scanning device comprises organic photodetectors or photodetectors based on amorphous silicon.

18. A control panel, comprising:
a scanning device, the scanning device being configured for obtaining instantaneously an image of a surface of interest,
a front panel with a front side surface facing a user and a back side surface facing the scanning device and thus of which an image can be obtained, and
at least one controller element mounted in the front panel and having contrast markings at the back side facing the scanner device with respect to a color of other portions of the back side of the front panel so that a state of the at least one controller is recognizable from an optical image of the back side of the front panel;
wherein the at least one controller element comprises a concave surface facing the scanning device, for converging radiation, incident on the at least one controller element, onto the scanning device, the concave surface being adapted for focusing incident radiation on the scanning device.

19. The control panel according to claim 18, wherein the scanning device comprises organic photodetectors or photodetectors based on amorphous silicon.

* * * * *